(12) United States Patent
Fujii et al.

(10) Patent No.: US 7,605,467 B2
(45) Date of Patent: Oct. 20, 2009

(54) PACKAGE AND ELECTRONIC APPARATUS USING THE SAME

(75) Inventors: Yoshio Fujii, Chiyoda-ku (JP); Hiroshi Fukumoto, Chiyoda-ku (JP); Shinpei Ogawa, Chiyoda-ku (JP); Yoshinori Yokoyama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 579 days.

(21) Appl. No.: 11/530,692

(22) Filed: Sep. 11, 2006

(65) Prior Publication Data

US 2007/0114620 A1 May 24, 2007

(30) Foreign Application Priority Data

Nov. 24, 2005 (JP) .............................. 2005-338600

(51) Int. Cl.
*H01L 23/12* (2006.01)
(52) U.S. Cl. .................. 257/733; 257/680; 257/731
(58) Field of Classification Search ................. 257/680, 257/728, 731, 733
See application file for complete search history.

(56) References Cited

U.S. PATENT DOCUMENTS

| | | | | |
|---|---|---|---|---|
| 6,303,986 B1 * | 10/2001 | Shook | ......................... | 257/680 |
| 6,441,481 B1 * | 8/2002 | Karpman | ..................... | 257/711 |
| 6,603,183 B1 * | 8/2003 | Hoffman | ..................... | 257/434 |
| 6,696,645 B2 | 2/2004 | Margomenos et al. | | |
| 6,713,844 B2 * | 3/2004 | Tatsuta et al. | ................ | 257/629 |
| 6,762,937 B2 * | 7/2004 | Kimoto et al. | .............. | 361/699 |
| 6,764,875 B2 * | 7/2004 | Shook | ......................... | 438/106 |
| 7,125,744 B2 * | 10/2006 | Takehara et al. | ............. | 438/106 |
| 7,378,748 B2 * | 5/2008 | Shimizu et al. | .............. | 257/787 |
| 2002/0090752 A1 * | 7/2002 | Nakanishi | .................... | 438/107 |
| 2004/0232535 A1 * | 11/2004 | Tarn | ............................ | 257/680 |
| 2005/0212067 A1 * | 9/2005 | Duboc et al. | ................. | 257/415 |

FOREIGN PATENT DOCUMENTS

JP 2004-160654 6/2004
JP 2004-209585 7/2004

OTHER PUBLICATIONS

Alexandros Margomenos, et al. "Ultra-Wideband Three Dimensional Transitions for On-Wafer Packages", 34th European Microwave Conference, Amsterdam, 2004, pp. 645-648.
Jeremy Muldavin, et al., "Wide-Band Low-Loss MEMS Packaging Technology", 2005 IEEE MTT-S International Microwave Symposium, vol. 2 of 4, Long Beach, CA, Jun. 12-17, 2005, 9 pages including cover sheets.

* cited by examiner

*Primary Examiner*—Fernando L Toledo
(74) *Attorney, Agent, or Firm*—Oblon, Spivak, McClelland, Maier & Neustadt, L.L.P.

(57) ABSTRACT

An upper sealing ring and a lower sealing ring are adhered by sealing solder. The width of tip end of sealing projection is narrower than the width of the lower sealing ring. Therefore, the sealing solder is placed on lower sealing ring and on the side surface of upper sealing ring. Further, an upper connection pad and a lower connection pad are adhered by connecting solder. The width of a tip end of a connection projection is narrower than the width of lower connection pad. Therefore, the connecting solder is placed on the lower connection pad and on the side surface of upper connection pad. Thus, a package is provided, which attains satisfactory electrical connection and hermetic seal after solder joint of the upper and lower substrates.

14 Claims, 7 Drawing Sheets

PACKAGE AND ELECTRONIC APPARATUS USING THE SAME

BACKGROUND OF THE INVENTION

1. Field of the Invention

The present invention relates to a package forming a prescribed space by upper and lower substrates, and an electronic apparatus having an electronic component provided in the prescribed space.

2. Description of the Background Art

Conventionally, passive and active electronic functional devices (hereinafter simply referred to as "devices") including electronic components, such as semiconductor chips, electronic circuit components and MEMS (Micro Electro Mechanical Systems) have been used. It is necessary to ensure reliability of these devices by preventing damages and degradation of characteristics during manufacturing process, storage and use. For this purpose, such a device is encapsulated by a sealing member formed of resin, metal, silicon or ceramics. In other words, the device is formed as a package.

By way of example, a compound semiconductor chip of a high frequency amplifier is formed as a package in order to prevent degradation caused by humidity. An MEMS device such as a high frequency switch or a micro sensor is formed as a package sealed by a plurality of substrates, in order to prevent a structure including a hollow portion from being exposed to dust and moisture.

Further, a silicon substrate or a ceramic substrate is used for hermetic sealing. Here, it is necessary to form an interconnection to electrically conduct a device in the package to a device outside the package. For this purpose, a so called feed through interconnection, which extends from the inside to the outside of the package in parallel with the substrates is used, or a through interconnection penetrating through the substrates in the depth direction is formed in the package.

The conventional package described above requires satisfactory hermetic seal. Further, the conventional package described above requires satisfactory electric connection between the upper and lower substrates.

SUMMARY OF THE INVENTION

The present invention was made to solve the above-described problems, and an object is to provide a package enabling satisfactory hermetic seal as well as an electronic apparatus having an electronic component provided in such a package. Another object is to provide a package providing satisfactory electric connection as well as an electronic apparatus having an electronic component provided in such a package.

According to an aspect, the present invention provides a package, including a lower substrate, and an upper substrate mounted on the lower substrate and forming, together with the lower substrate, a sealed space. On the lower substrate, a lower sealing ring surrounding a prescribed region is provided. The upper substrate includes a ring-shaped sealing projection corresponding to the lower sealing ring. On a surface of the sealing projection, an upper sealing ring is provided. The upper and lower sealing rings are adhered by sealing solder. The width of a tip end of sealing projection is narrower than the width of lower sealing ring. The sealing solder is positioned on the lower sealing ring and on a side surface of the upper sealing ring.

In the structure described above, when the upper and lower substrates are joined by the sealing solder, the melted sealing solder is prevented from spreading over the main surface of the upper or lower substrate. As a result, satisfactory state of hermetic seal can be attained. If the package is an electronic apparatus having an electronic component encapsulated therein, possibility of short-circuit between interconnections in the package can be reduced.

According to another aspect, the present invention provides a package including a lower substrate and an upper substrate mounted on the lower substrate. On the lower substrate, a lower connection pad is provided. The upper substrate includes a connection projection corresponding to the lower connection pad. On the surface of the connection projection, an upper connection pad is provided. The upper and lower connection pads are joined by connecting solder. The width of a tip end of connection projection is narrower than the width of lower connection pad. The connecting solder is positioned on the lower connection pad and on a side surface of the upper connection pad.

In the structure described above, satisfactory electrical connection can be attained between the upper and lower substrates. When the upper and lower substrates are joined by the connecting solder, the melted connecting solder is prevented from spreading over the main surface of the upper or lower substrate. As a result, possibility of short-circuit between interconnections in the package can be reduced.

According to a further aspect, the present invention provides a package including a lower substrate, and an upper substrate mounted on the lower substrate and forming, together with the lower substrate, a sealed space. On the lower substrate, a lower sealing ring surrounding a prescribed region is provided. The upper substrate includes a ring-shaped sealing projection corresponding to the lower sealing ring. On a surface of the sealing projection, an upper sealing ring is provided. The upper and lower sealing rings are adhered by sealing solder. The width of a tip end of sealing projection is narrower than the width of lower sealing ring. The sealing solder is provided on the lower sealing ring and on a side surface of the upper sealing ring. On the lower substrate, a lower connection pad is provided. The upper substrate includes a connection projection corresponding to the lower connection pad. On the surface of the connection projection, an upper connection pad is provided. The upper and lower connection pads are joined by connecting solder. The width of a tip end of connection projection is narrower than the width of lower connection pad. The connecting solder is positioned on the lower connection pad and on a side surface of the upper connection pad.

The structure provides the effects attained by the packages in accordance with the one and another aspects of the invention as described above and, in addition, provides the effect that sealing of the package and electrical connection between the upper and lower substrates can be attained simultaneously. Therefore, the process of manufacturing the package can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the package and electronic apparatus in accordance with embodiments of the present invention will be described with reference to the figures.

Embodiment 1

Figure 1:
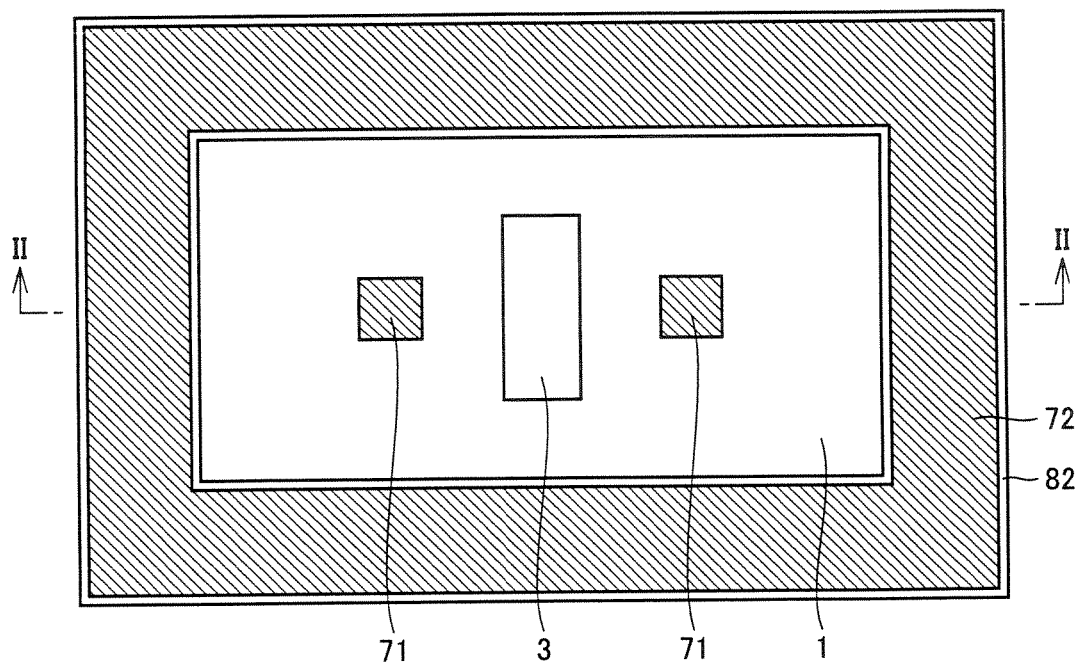
FIG. 1 is a plan view of a package in accordance with Embodiment 1.
Figure 2:
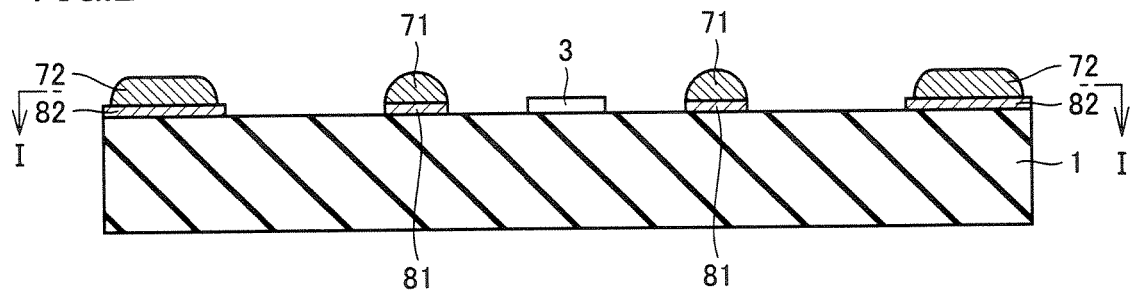
FIG. 2 is a cross sectional view taken along the line II-II of FIG. 1.
Figure 3:
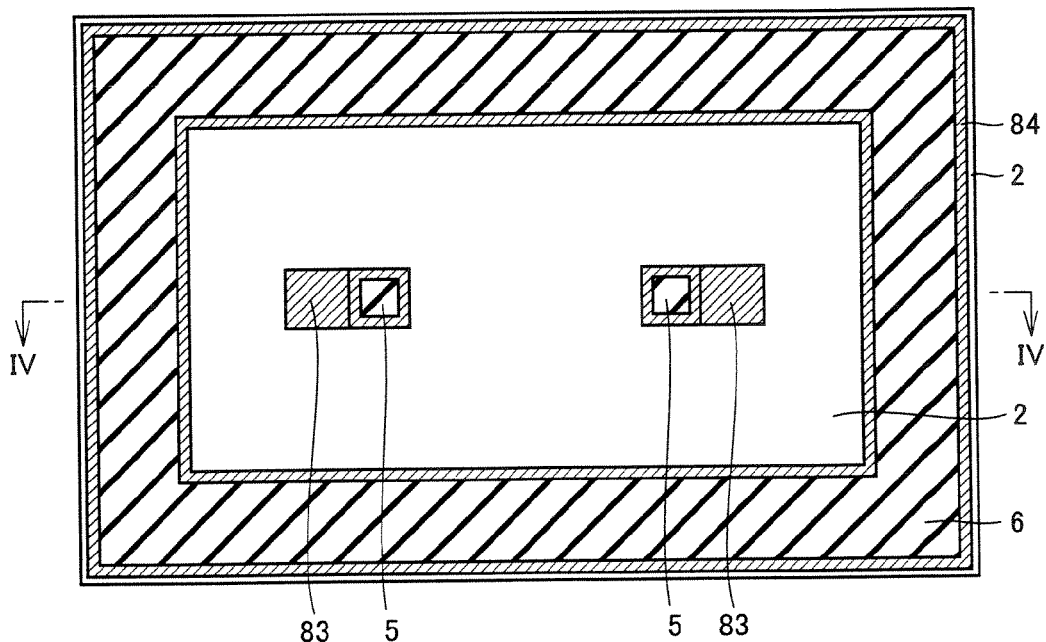
FIG. 3 is a plan view of the package in accordance with Embodiment 1.
Figure 4:
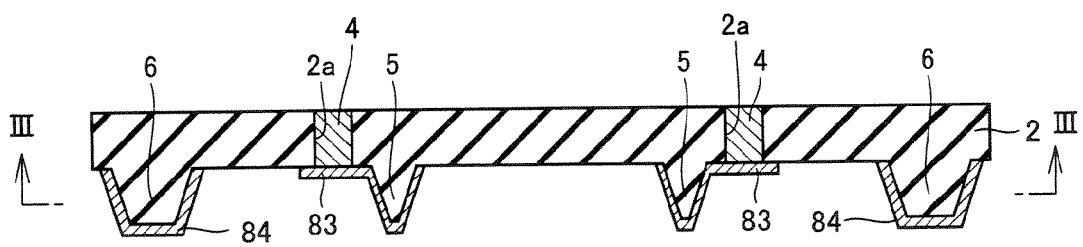
FIG. 4 is a cross sectional view taken along the line IV-IV of FIG. 1.
Figure 5:
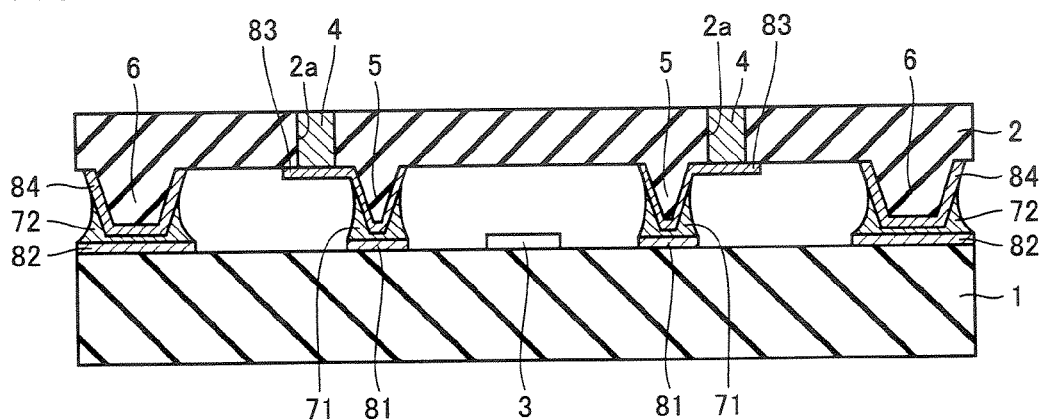
FIG. 5 is a cross sectional view of the package in accordance with Embodiment 1.

FIGS. 1 and 2 are a plan view of a lower substrate of a package in accordance with Embodiment 1 of the present invention and a cross sectional view taken along the line II-II thereof, respectively. FIGS. 3 and 4 are a plan view of an upper substrate of a package in accordance with Embodiment 1 of the present invention and a cross sectional view taken along the line IV-IV thereof, respectively. FIG. 5 is a cross-sectional view of the device sealed, with the upper and lower substrates joined. The package shown in FIG. 5 shows a semiconductor apparatus as an electronic component package, encapsulating an electronic component such as a semiconductor device. The package of the present invention, however, may encapsulate any component other than the semiconductor device.

As shown in FIGS. 1 and 2, on a lower substrate 1, a device 3, a lower connection pad 81 and a lower sealing ring 82 are provided. Lower sealing ring 82 has a ring-shape and formed to surround the device 3 and lower connection pad 81, as a prescribed region as defined in the present invention. To the lower connection pad 81, an interconnection pattern (not shown) drawn from device 3 and its peripheral circuit (not shown) may be connected. On lower connection pad 81, connecting solder 71 is applied. Further, on lower sealing ring 82, sealing solder 71 is applied in a ring-shape, corresponding to the lower sealing ring 82.

As shown in FIGS. 3 and 4, on upper substrate 2, a through interconnection 4 is provided, passing through upper substrate 2 in the depth direction, to electrically connect a device outside the upper substrate 2 and a device inside the upper substrate 2. Further, on upper substrate 2, an upper connection pad 83 is provided to be connected to through interconnection 4. Further, on upper substrate 2, a connection projection 5 is provided at a position corresponding to connection pad 81. Upper connection pad 83 extends over the surface of connection projection 5 to cover connection projection 5.

Further, as can be seen from FIG. 5, in the state in which the lower and upper substrates 1 and 2 are joined together, the width of the tip end of connection projection 5 is narrower than the width of lower connection pad 81. On upper substrate 2, a sealing projection 6 is provided at a position opposite to sealing ring 82, and on sealing projection 6, an upper sealing ring 84 is provided. The width of tip end of sealing projection 6 is narrower than the width of lower sealing ring 82.

The lower and upper substrates 1 and 2 are joined by solder, and the package is sealed. For this purpose, first, connecting solder 71 and sealing solder 72 shown in FIGS. 1 and 2 are heated and melted at a temperature not lower than the melting point. In this state, the lower substrate 1 and the upper substrate 2 are pressed to each other, so that connection projection 5 and sealing projection 6 shown in FIGS. 3 and 4 are driven into connecting solder 71 and sealing solder 72, respectively, with upper connection pad 83 and upper sealing ring 84 posed therebetween. Thereafter, the package is cooled. Thus, the sealing of package is completed as shown in FIG. 5.

When the lower substrate 1 and upper substrate 2 are joined together, connecting solder 71 goes up over and along the side surface of upper connection pad 83. Therefore, an electric connection path between the upper substrate 2 and lower substrate 1 consisting of lower connection pad 81, connecting solder 71, upper connection pad 83 and through interconnection 4 is formed. Further, sealing solder 72 goes up over and along the side surface of upper sealing ring 84. Therefore, device 3 is sealed by upper substrate 2 and lower substrate 1. Specifically, the space surrounded by upper substrate 2 and lower substrate 1 is sealed against outer atmosphere. Thus, device 3 is not exposed to the outer atmosphere.

In the package in accordance with the present embodiment, the width of the tip end of connection projection 5 is narrower than the width of lower connection pad 81. Therefore, at the time of joining with solder, melted solder 71 for connection does not run over the lower connection pad 81 when connection projection 5 is driven into connecting solder 71. At this time, an oxide film at the surface of melted solder 71 for connection is torn by the tip end of connection projection 5, and an unoxidized, fresh surface of solder appears. The fresh surface of solder and upper connection pad 83 come into contact, and connecting solder 71 goes up over and along the side surface of upper connection pad 83. This improves electrical connection between lower substrate 1 and upper substrate 2. Further, according to the method described above, even when the dimensional accuracy of connection projection 5 and sealing projection 6 is not very high and positional accuracy between connection projection 5 and sealing projection 6 and connection pad 81 and sealing ring 82 is not very high, satisfactory solder joint can be attained. Further, connecting solder 71 melted and pressed at the time of solder joint is placed on the lower connection pad 81 and on the side surface of upper connection pad 83, and it does not spread over the main surface of lower substrate 1 or upper substrate 2. Therefore, there is no possibility of short-circuit between interconnections in the package.

Further, at the portion for sealing joint of the package in accordance with Embodiment 1, effects similar to those attained at the joint for electrical connection can be attained. Specifically, the following effects can be attained. The width of tip end of sealing projection 6 is narrower than the width of lower sealing ring 82. Therefore, as shown in FIG. 5, at the time of solder joint, melted solder 72 for sealing does not run over the lower sealing ring 82 when sealing projection 6 is driven into sealing solder 72. At this time, an oxide film at the surface of sealing solder 72 is torn by the tip end of sealing projection 6, and an unoxidized, fresh surface of solder appears. The fresh surface of solder and upper sealing ring 84 come into contact, and sealing solder 72 goes up over and along the side surface of upper sealing ring 84. Thus, satisfactory hermetic seal can be attained.

Further, when the sealing method as described above is adopted, even when dimensional accuracy and positional accuracy of various portions are not very high, satisfactory hermetic seal of the device can be realized. Further, sealing solder 72 melted and pressed at the time of solder joint adheres to lower sealing ring 82 and on the inner side surface and outer side surface of upper sealing ring 84, and therefore it does not spread in the direction along the main surface of upper substrate 2 or lower substrate 1. As a result, there is no possibility of short-circuit between interconnections in the package due to solder joint between the upper substrate 2 and lower substrate 1. Further, by the method of manufacturing the package described above, electrical connection between upper and lower substrates 2 and 1 and sealing of the package are attained simultaneously at one step of solder joint, and therefore, the process for manufacturing the package can be simplified.

Next, the method of manufacturing the package in accordance with the present embodiment will be described in detail.

First, lower substrate 1 is prepared. Preferable material for lower substrate 1 includes a semiconductor such as silicon or gallium arsenide, or ceramics such as alumina. In the present embodiment, a silicon substrate is used as lower substrate 1.

Figure 6:
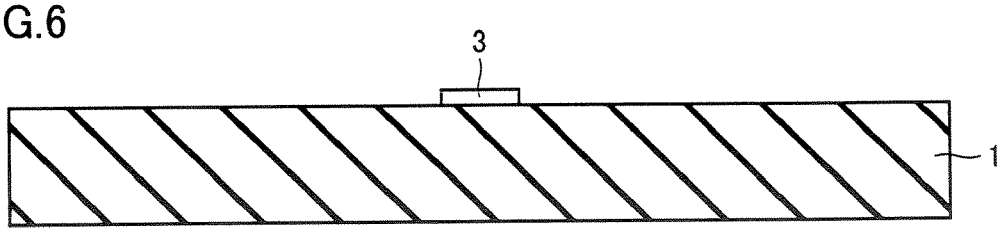
FIGS. 6 to 11 are cross sectional views showing steps of manufacturing the package in accordance with Embodiment 1.

Next, as shown in FIG. 6, device 3 is mounted on lower substrate 1. When a semiconductor integrated circuit chip or a discrete electronic circuit device is used as device 3, the device 3 may be mounted by flip-chip bonding on lower substrate 1. When a micro sensor or micro actuator such as an MEMS is used as device 3, the device 3 may be directly formed through semiconductor process on the surface of lower substrate 1.

Figure 7:
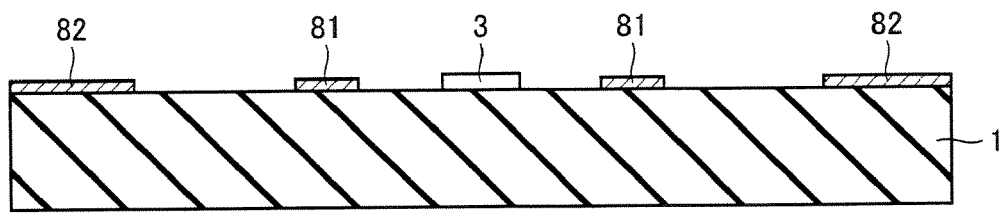

Next, as shown in FIG. 7, lower connection pad 81 and lower sealing ring 82 are formed as a metal film pattern on lower substrate 1. Lower sealing ring 82 is formed to have a ring shape that surrounds lower connection pad 81, device 3 and other interconnections and circuits to be sealed. As the method of forming the metal film, plating or sputtering may be used.

Preferably, material having good solder wettability, such as Cu, Fe or Ni is used as the main material of the metal film. A composite film or an alloy of Cu, Fe or Ni may be used. The thickness of metal film is desirably 0.3 µm to 50 µm and, more desirably, 1 µm to 10 µm. An adherence reinforcing layer of Cr or Ti may be inserted between such a metal film and lower substrate 1. In that case, preferable thickness of adherence reinforcing layer is 0.005 µm to 0.2 µm.

Preferably, on the surface of the metal film, an Au film, an Sn film or the like is formed to improve solder wettability. Desirable thickness of the film for improving solder wettability is 0.01 µm to 1 µm. In the present embodiment, a three-layered film having a Cr film having the thickness of 0.05 µm, an Ni film having the thickness of 2 µm and an Au film having the thickness of 0.1 µm stacked in this order may be used as the metal film.

Figure 8:
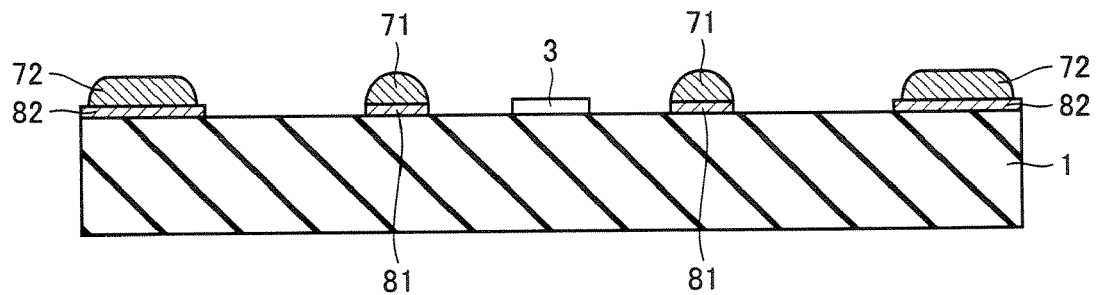

On the other hand, as shown in FIG. 8, connecting solder 71 is provided on lower connection pad 81, and sealing solder 72 is provided on lower sealing ring 82. As to the method of applying solder, vapor deposition, plating, injection of melted solder to the pad or ring by ink-jet, or placing a bulk solder formed by punching on the pad or ring may be used, and various other methods may be available. Preferable solder material includes Sn—Pb, Sn—Ag, Sn—Cu or Sn—Ag—Cu, or various other solder materials may be used. In the present embodiment, Sn—Ag—Cu is used as the solder material. Through the manufacturing steps shown in FIGS. 6 to 8 described above, the connecting portion and sealing portion of lower substrate 1 are completed.

Thereafter, upper substrate 2 is prepared. Preferable material for upper substrate 2 includes a semiconductor such as silicon or gallium arsenide, ceramics such as alumina, or glass such as pyrex (registered trademark). In the present embodiment, a silicon wafer having the surface orientation of (100) is used as upper substrate 2.

Then, upper substrate 2 is chipped off from one main surface to a prescribed depth. Consequently, connection projection 5 and ring-shaped sealing projection 6 are formed. The position of connection projection 5 corresponds to the lower connection pad 81, and the width of tip end of connection projection 5 is narrower than the width of lower connection pad 81. The position of sealing projection 6 corresponds to lower sealing ring 82, and the width of tip end of sealing projection 6 is narrower than the width of lower sealing ring 82. As to the method of chipping the upper substrate, various methods may be used dependent on the material.

Figure 9:
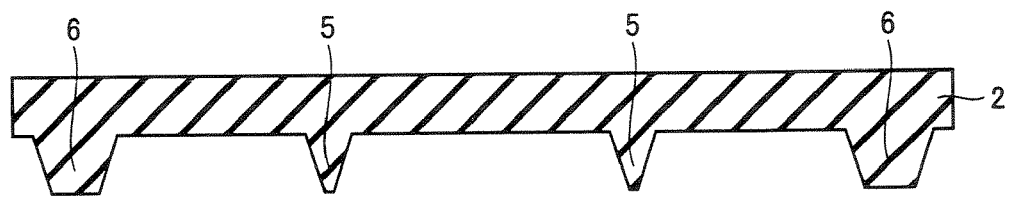

When the main component of upper substrate 2 is silicon, wet etching, or dry etching such as reactive ion etching may be used. When the main component of upper substrate 2 is ceramics, the row material for forming upper substrate 2 may be poured into a mold, and the row material is fired, so that upper substrate 2 having the desired shape such as shown in FIG. 9 is formed. When the main component of upper substrate 2 is glass, upper substrate 2 is formed by sandblasting or the like.

In the embodiment above, a silicon substrate is etched by wet etching using potassium hydroxide solution, whereby connection projection 5 and ring-shaped sealing projection 6 are formed. By the wet etching, (111) crystal plane of silicon selectively appears, and therefore, the side surface of connection projection 5 comes to be an inclined surface at an angle of 55° with respect to the (100) plane, as shown in FIG. 9. In the package of the present embodiment, the side surface of connection projection 5 is inclined as described above, and therefore, disconnection of metal interconnection formed on connection projection 5 is better prevented.

Figure 10:
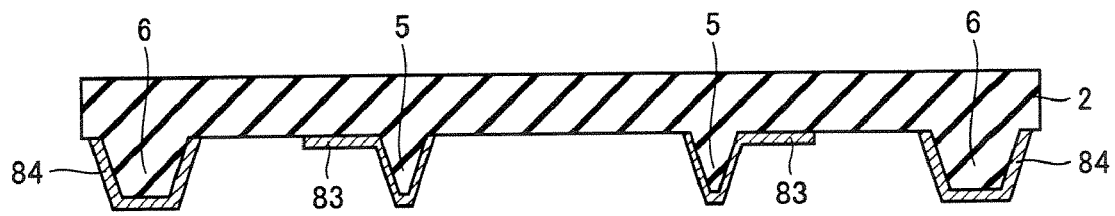

Then, as shown in FIG. 10, upper connection pad 83 and sealing ring 84 are formed as a metal pattern, on upper substrate 2. Upper connection pad 83 is formed to cover at least the connection projection 5, while upper sealing ring 84 is formed in a ring-shape to cover at least the sealing projection 6. The method of forming, material and thickness of the metal film are the same as the method of forming, material and thickness of lower connection pad 81 and lower sealing ring 82, respectively.

Next, a through hole 2a of upper substrate 2 is formed, and a conductor is filled in through hole 2a. Thus, through interconnection 4 exposed to the outside of upper substrate 2 and reaching upper connection pad 83 is formed. Through interconnection 4 enables electrical connection between the device 3 in the package and a device outside the package. As to the method of forming the through interconnection, a conductor film may be formed extending along an inner wall surface of through hole 2a. It is noted that the through interconnection may be of any form, provided that it is formed in through hole 2a and capable of connecting upper connection pad 83 to an external device.

Figure 11:
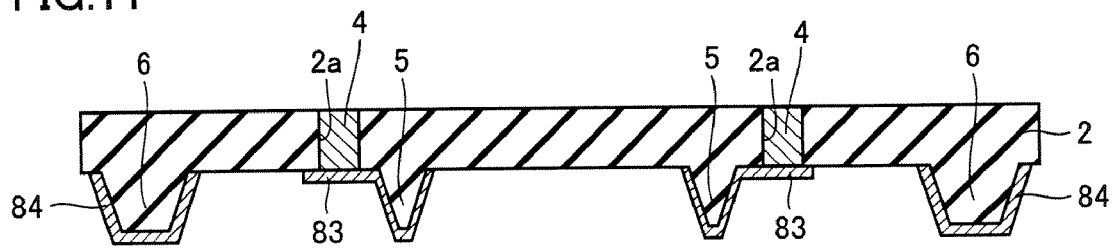

Through hole 2a described above may be formed by various etching technique, sandblasting or the like similar to connection projection 5 or sealing projection 6, or it may be formed by mechanical processing or laser processing. The conductor to be filled in the through hole 2a or formed along the inner wall surface of through hole 2a may be formed by plating, sputtering, injection of melted metal into through hole 2a by ink-jet, CVD (Chemical Vapor Deposition) or sintering. Preferable material for the conductor may include Cu, Au, Ag, Ni, W, Au—Sn, Sn—Pb, Sn—Ag, Sn—Cu or Sn—Ag—Cu, while various other solder materials may be used. In the present embodiment, Sn—Ag—Cu is used as the conductor material. Through the steps of manufacturing shown in FIGS. 9 to 11, the connecting portion and sealing portion of upper substrate 2 are completed.

In the description above, a method of forming the connecting portion and sealing portion of each of the upper substrate 2 and lower substrate 1 of a single package has been described. It may be possible that silicon is used as the substrate material, and the upper and lower substrates are formed through semiconductor process. In such a case, the device may be formed directly on the substrate wafer.

Next, the manner how the lower substrate 1 and upper substrate 2 positioned opposite to each other are jointed by solder and sealed will be described in detail.

First, in a vacuum furnace, lower substrate 1 and upper substrate 2 are placed. Using a positioning mark, lower and upper substrates 1 and 2 are aligned. Thereafter, lower and upper substrates 1 and 2 are heated at a temperature not lower than the melting point of connecting solder 71. In the present embodiment, Sn—Ag—Cu having the melting point of 220° C. is used as the solder material, and therefore, lower and upper substrates 1 and 2 are heated at 270° C., higher than 220° C. Next, nitrogen as an inert gas is introduced to the vacuum furnace. Thereafter, lower and upper substrates 1 and 2 are pressed to each other with the force of 20 g per 1 $cm^2$. Then, lower and upper substrates 1 and 2 are left in an atmosphere of room temperature, so that the temperature of lower and upper substrates 1 and 2 lowers to the room temperature.

The package manufactured through the above-described steps was cross-sectioned, and it was found that connecting solder 71 melted at the time of solder joint was kept on lower connection pad 81 and on both side surfaces of upper connection pad 83, and not spread over the main surface of upper substrate 2 or lower substrate 1. Further, sealing solder 72 was kept on lower sealing ring 82 and on both side surfaces of upper sealing ring 84, and not spread over the main surface of upper substrate 2 or lower substrate 1. In other words, it was confirmed that a package having the cross-sectional structure similar to that shown in FIG. 5 was obtained.

Figure 12:
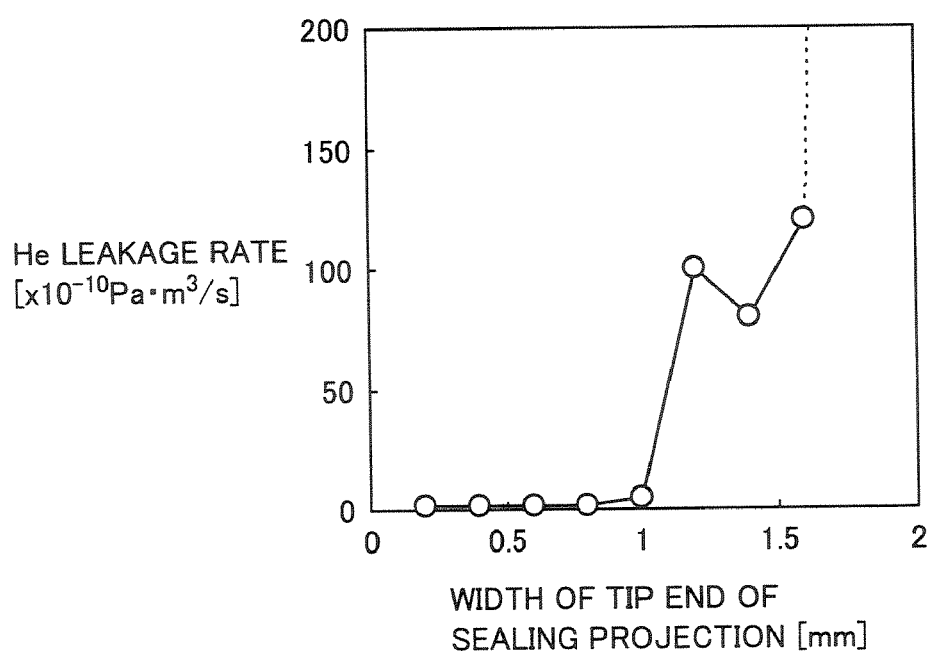
FIG. 12 is a graph representing hermetic seal characteristic of the package in accordance with Embodiment 1.

Next, performance of hermetic seal of the obtained package was examined. Under the condition that the package size was 10 mm×10 mm and the width of each of upper sealing ring 84 and lower sealing ring 82 was fixed at 1 mm, the width of tip end of sealing projection 6 was changed variously, while leakage rate of helium was measured. FIG. 12 shows the result of measurement. When the width of tip end of sealing projection 6 is narrower than the width of lower sealing ring 82, leakage rate of helium is close to a limit of measurement, that is, the lowest measurable value. Namely, very tight hermetic seal was attained. When the width of tip end of sealing projection 6 was made larger than the width of lower sealing ring 82, leakage rate of helium increased significantly.

Figure 13:
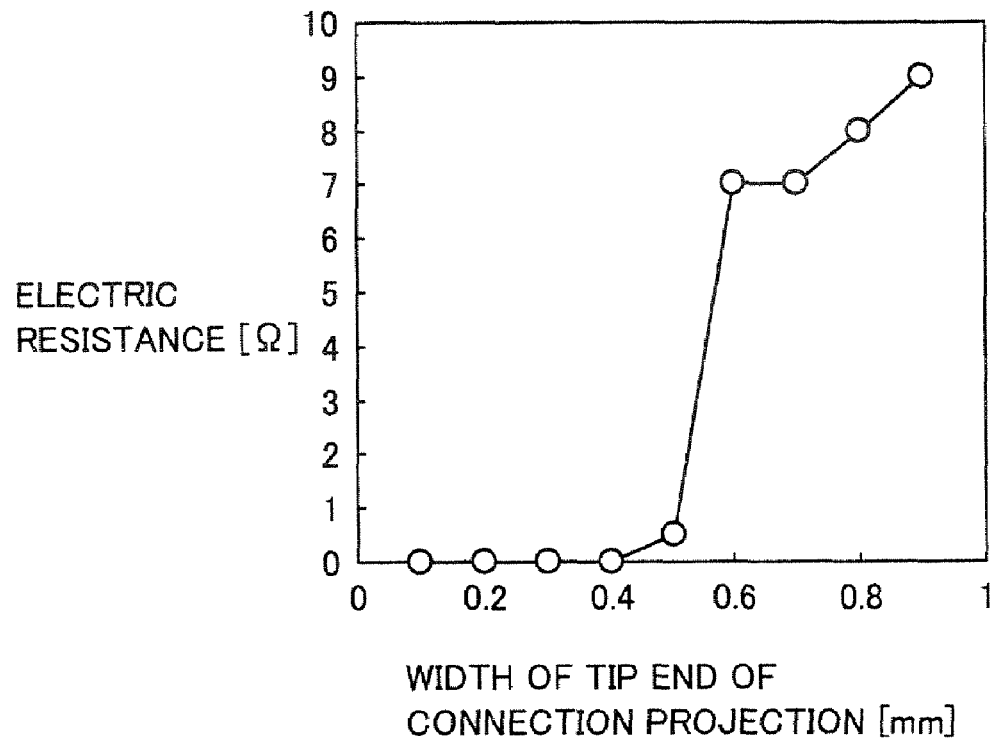
FIG. 13 is a graph representing electrical connection characteristic between upper and lower substrates of the package in accordance with Embodiment 1.

Then, electric resistance as an index representing electrical connection performance between upper substrate 2 and lower substrate 1 was examined. Under the condition that the package size was 10 mm×10 mm and the width of each of upper connection pad 83 and lower connection pad 81 was fixed at 0.5 mm, the width of tip end of connection projection 5 was changed variously, while electric resistance of electrical connection path from lower connection pad 81 to upper connection pad 83 was measured. FIG. 13 shows the result of measurement. When the width of tip end of connection projection 5 was narrower than the width of lower connection pad 81, the electric resistance was close to the limit of measurement, that is, the lowest measurable value. Namely, electrical connection between the upper and lower substrates 2 and 1 was satisfactory. When the width of tip end of connection projection 5 was made larger than the width of lower connection pad 81, electric resistance increased significantly.

Embodiment 2

Figure 14:
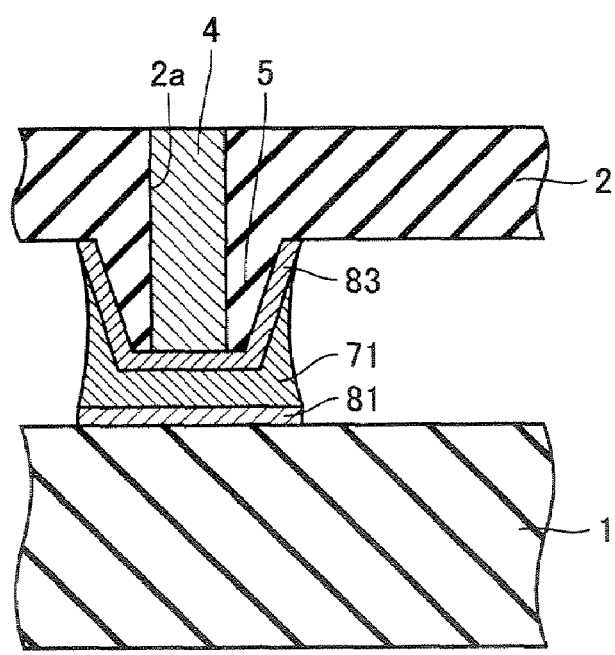
FIGS. 14 to 16 are cross sectional views of electrical connection path of packages in accordance with Embodiments 2, 3 and 4.

Next, referring to FIG. 14, the package and the electronic apparatus in accordance with Embodiment 2 of the present invention will be described.

In the package of Embodiment 1, connection projection 5 and through interconnection 4 were formed at different positions. In the present embodiment, through interconnection 14 is formed at the same position as connection projection 5. Specifically, through interconnection 14 is formed to pass through connection projection 5. Accordingly, electrical connection path between upper and lower substrates 2 and 1 occupies smaller area of the substrates, and therefore, the package can advantageously be made smaller.

Embodiment 3

Figure 15:
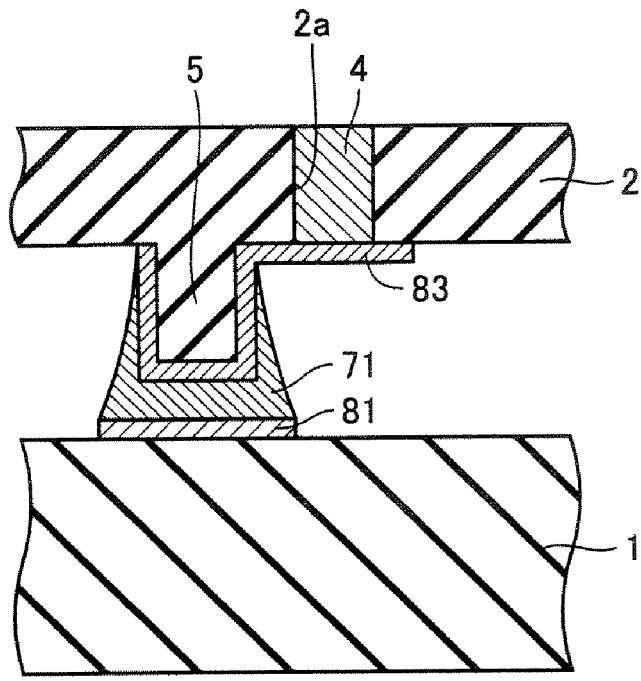

Next, referring to FIG. 15, the package and the electronic apparatus in accordance with Embodiment 3 of the present invention will be described.

In the package of Embodiment 1, connection projection 5 is formed by wet etching, and therefore, the side surface of connection projection 5 is inclined. In the package in accordance with the present embodiment, connection projection 5 is formed by reactive ion etching, as one example of dry etching, and therefore, connection projection 5 is formed with its side surface extending approximately vertical to the main surface of upper substrate 2, as shown in FIG. 15. As a result, electrical connection path between upper and lower substrates 2 and 1 occupies smaller area of the substrates, and therefore, the package can advantageously be made smaller.

Embodiment 4

Figure 16:
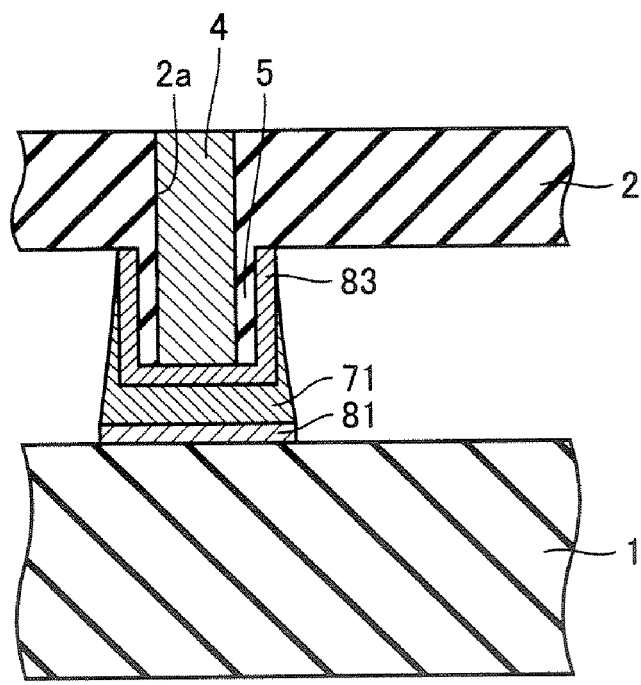

Next, referring to FIG. 16, the package and the electronic apparatus in accordance with Embodiment 4 of the present invention will be described.

In the package in accordance with Embodiment 3, through interconnection 4 and connection projection 5 extending approximately vertical to the main surface of upper substrate 2 are formed at different positions. In the package in accordance with the present embodiment, however, through interconnection 4 is formed at the same position as connection projection 5, as shown in FIG. 16. Specifically, through interconnection is formed to pass through connection projection 5. Accordingly, the area of the substrate occupied by the electrical connection path between upper and lower substrates 2 and 1 can further be reduced, and therefore, the package can advantageously be made even smaller.

In the packages of Embodiments 1 to 4 described above, connection projection 5 may have a bar-like shape protruded from upper substrate 2 or beam-like shape protruded from upper substrate 2, and similar effects can be attained regardless of the shape.

Figure 17:
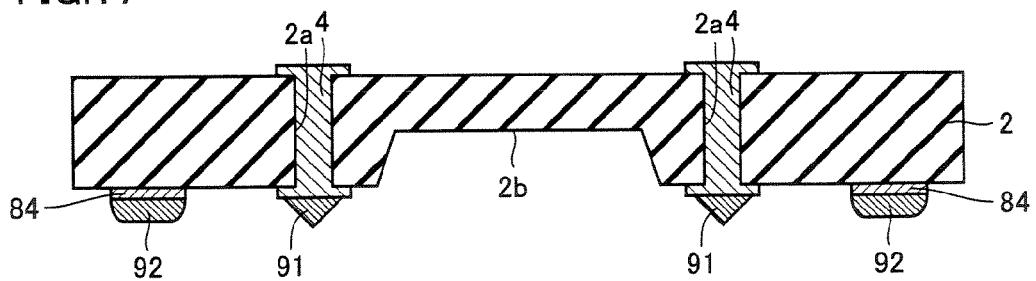
FIGS. 17 and 18 are cross sectional views of upper and lower substrates of a package in accordance with a comparative example.
Figure 18:
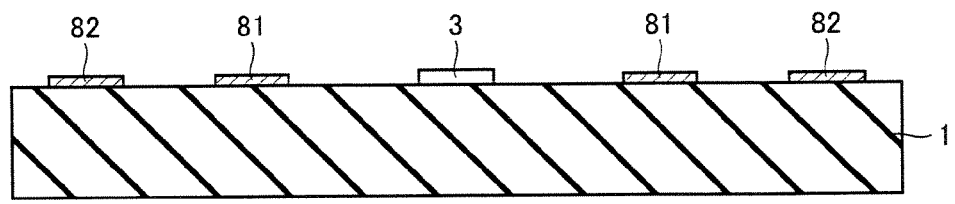

Next, referring to FIGS. 17 and 18, a package as a comparative example will be described. FIG. 17 is a cross-sectional view representing an upper substrate of a package as the comparative example. FIG. 18 is a cross-sectional view representing a lower substrate of the package as the comparative example. A package similar to the comparative example is disclosed in Japanese Patent Laying-Open Nos. 2004-209585 and 2004-160654.

In the package of the comparative example, device 3 is provided on lower substrate 1 as shown in FIGS. 17 and 18. Lower and upper substrates 1 and 2 are joined at the position of lower sealing ring 82 and upper sealing ring 84. On upper substrate 2, through interconnection 4 is formed, by filling metal in through hole 2a. Further, a gold stud bump 91 is formed on the surface of through interconnection 4. On upper sealing ring 84, gold plating 92 is provided. When upper substrate 2 and lower substrate 1 are pressed to each other and ultra-sonic wave is applied, gold stud bump 91 and lower connection pad 81 are joined, and gold plating 92 and lower sealing ring 82 are joined. Thus, electrical connection and sealing of upper and lower substrates 2 and 1 are attained simultaneously. It is noted that a cavity (recess) 2b is formed at a portion of upper substrate 2 opposite to device 3, corresponding to the height of device 3.

The package of comparative example described above has a problem that device 3, upper substrate 2 or lower substrate 1 may possibly be damaged by ultrasonic vibration at the time of joining.

In order to avoid such a problem, it is possible to provide solder at positions of gold stud bump 91 and gold plating 92, and to join the upper and lower substrates 2 and 1 not by ultrasonic bonding but by solder joint. According to this method, however, when upper and lower substrates 2 and 1 are pressed to each other and the solder is melted, the connecting solder spreads over the main surface of upper substrate 2 or lower substrate 1, possibly causing electrical short-circuit between the interconnections in the package. Further, as the sealing solder spreads on the main surface of upper substrate 2 or lower substrate 1, necessary solder for sealing might not be left at the necessary position for sealing, and hermetic seal would be insufficient.

Further, in order to join the pad or ring by melted solder, an unoxidized, fresh surface of melted solder must be in contact with the pad. In general soldering, a flux is used for removing the oxide film on the solder. From the viewpoint of preventing device contamination, introduction of a flux is undesirable. When the flux is not used, the solder oxide film on the surface of melted solder exists between the solder and the pad, hindering successful solder joint, possibly causing unsatisfactory electrical connection between upper and lower substrates 2 and 1 or unsatisfactory sealing at the sealing joint.

Figure 19:
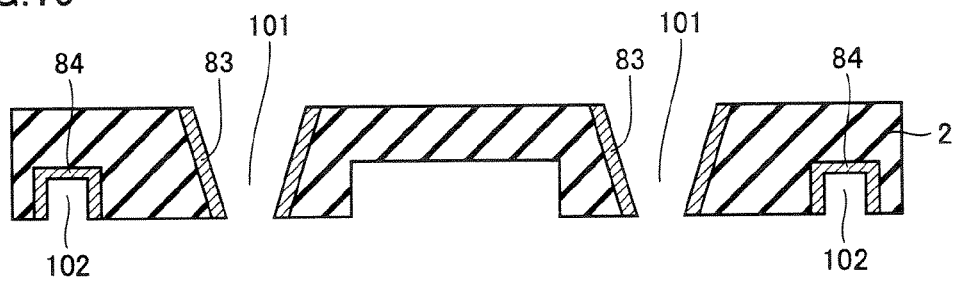
FIGS. 19 and 20 are cross sectional views of upper and lower substrates of a package in accordance with another comparative example.
Figure 20:
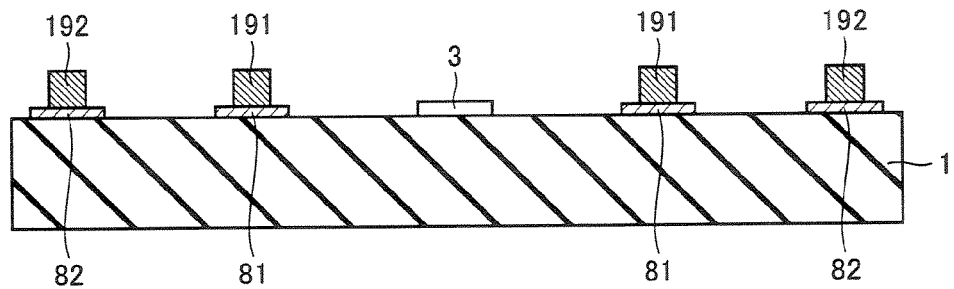

Next, referring to FIGS. 19 and 20, a package in accordance with another comparative example will be described. FIG. 19 is a cross sectional view showing an upper substrate of the package in accordance with this comparative example. FIG. 20 is a cross sectional view showing a lower substrate of the package in accordance with this comparative example. In the package of this comparative example, as shown in FIGS. 19 and 20, connecting solder plating 191 and ring-shaped sealing solder plating 192 are respectively provided on lower connection pad 81 and lower sealing ring 82 on lower substrate 1. At a position of upper substrate 2 corresponding to connecting solder plating 191, a through hole 101 having an upper connection pad 83 formed on its inner surface is provided, and at a position of upper substrate 2 opposite to sealing solder plating 192, a ring-shaped trench 102 having upper sealing ring 84 formed on its inner surface is provided.

When the substrates are jointed together, connecting solder plating 191 and through hole 101 are fit together and sealing solder plating 192 and ring-shaped trench 102 are fit together, while upper and lower substrates 2 and 1 are heated to a temperature not lower than the melting point of the solder. Thus, connecting solder plating 191 and upper connection pad 83 are joined, and sealing solder plating 192 and upper sealing ring 84 are joined. As a result, electrical connection between upper and lower substrates 2 and 1 and sealing of the device are attained simultaneously.

In the package of this comparative example, at positions of upper substrate 2 opposite to connecting solder plating 191 and sealing solder plating 192, through hole 101 and trench 102 are provided. Therefore, when upper and lower substrates 2 and 1 are pressed together and the solder for joining is melted, possibility that the solder for joining spreads over the main surface of upper or lower substrate 2 or 1 is reduced. However, in order to maintain satisfactory state of solder joint when connecting solder plating 191 and through hole 101 are fit and sealing solder plating 192 and trench 101 are fit, connecting solder plating 191 and sealing solder plating 192 must have very high dimensional accuracy and very high positional accuracy. More specifically, when the dimension of connecting solder plating 191 and sealing solder plating 192 is too large or when there is a positional deviation between connecting solder plating 191 and sealing solder plating 192 and through hole 101 and trench 102, connecting solder plating 191 and sealing solder plating 192 running over from through hole 101 and trench 102 might spread over the main surface of upper substrate 2 or lower substrate 1. When the dimension of connecting solder plating 191 and sealing solder plating 192 is too small, upper connecting and upper sealing ring 84 would not be brought into contact, even when connecting solder plating 191 and sealing solder plating 192 are melted. Further, solder oxide film exists between the melted connecting solder plating 191 and sealing solder plating 192 and upper connection pad 83 and upper sealing ring 84, respectively, resulting in unsatisfactory electrical connection between upper and lower substrates 2 and 1 as well as unsatisfactory sealing at the sealing joint.

The packages in accordance with Embodiments 1 to 4 described above solve the problems experienced in the packages in accordance with the comparative examples shown in FIGS. 17 to 20.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A package, comprising:
   a lower substrate;
   an upper substrate including a ring-shaped sealing projection and attached to said lower substrate so as to form a sealed space with said lower substrate;
   a lower sealing ring provided so as to surround a prescribed region at a position corresponding to said sealing projection on said lower substrate and being greater in width than a tip end of said sealing projection;
   an upper sealing ring provided on a surface of said sealing projection;
   a sealing solder portion positioned on said lower sealing ring and on a side surface of said upper sealing ring so that said upper sealing ring and said lower sealing ring are joined to each other.

2. An electronic apparatus having an electronic component provided in the space between said upper substrate and said lower substrate of the package according to claim 1.

3. A package, comprising:

a lower substrate;

an upper substrate including a connection projection and attached to said lower substrate;

a lower connection pad provided at a position corresponding to said connection projection on said lower substrate and being greater in width than a tip end of said connection projection;

an upper connection pad provided on a surface of said connection projection;

a connecting solder portion positioned on said lower connection pad and on a side surface of said upper connection pad so that said upper connection pad and said lower connection pad are joined to each other.

4. The package according to claim 3, wherein a side surface of said connection projection is an inclined surface inclined with respect to a main surface of said upper substrate.

5. The package according to claim 3, wherein a side surface of said connection projection is a vertical surface extending approximately vertical to a main surface of said upper substrate.

6. The package according to claim 3, wherein said upper substrate has a through hole extending in a depth direction;

a through interconnection is formed in said through hole; and said through interconnection has one end electrically connected to said upper connection pad and the other end connectable to an external device.

7. The package according to claim 6, wherein said through interconnection extends in and through said connection projection.

8. An electronic apparatus having an electronic component provided in a space between said upper substrate and said lower substrate of the package according to claim 3.

9. A package, comprising:

a lower substrate;

an upper substrate including a ring-shaped sealing projection and a connection projection and attached to said lower substrate so as to form a sealed space with said lower substrate;

a lower sealing ring provided so as to surround a prescribed region at a position corresponding to said sealing projection on said lower substrate and being greater in width than a tip end of said sealing projection;

an upper sealing ring provided on a surface of said sealing projection;

a sealing solder portion positioned on said lower sealing ring and on a side surface of said sealing ring so that said upper sealing ring and said lower sealing ring are joined to each other;

a lower connection pad provided at a position corresponding to said connection projection on said lower substrate and being greater in width than a tip end of said connection projection;

an upper connection pad provided on a surface of said connection projection;

a connecting solder portion positioned on said lower connection pad and on a side surface of said upper connection pad so that said upper connection pad and said lower connection pad are joined to each other.

10. The package according to claim 9, wherein a side surface of said connection projection is an inclined surface inclined with respect to a main surface of said upper substrate.

11. The package according to claim 9, wherein a side surface of said connection projection is a vertical surface extending approximately vertical to a main surface of said upper substrate.

12. The package according to claim 9, wherein said upper substrate has a through hole extending in a depth direction;

a through interconnection is formed in said through hole; and said through interconnection has one end electrically connected to said upper connection pad and the other end connectable to an external device.

13. The package according to claim 12, wherein said through interconnection extends in and through said connection projection.

14. An electronic apparatus having an electronic component provided in the space between said upper substrate and said lower substrate of the package according to claim 9.

* * * * *